US009680356B2

(12) United States Patent
Seidenbinder et al.

(10) Patent No.: US 9,680,356 B2
(45) Date of Patent: Jun. 13, 2017

(54) ARCHITECTURE OF INTERCONNECTED ELECTRONIC POWER MODULES FOR ROTARY ELECTRICAL MACHINE, AND ROTARY ELECTRICAL MACHINE COMPRISING ARCHITECTURE OF THIS TYPE

(75) Inventors: Regis Seidenbinder, Choisy le Roi (FR); Bryann Lafabrie, Creteil (FR); Fabrice Tauvron, Athis Mons (FR); Cyrille Dheripre, Berck sur Mer (FR); David Delplace, Camiers (FR); Marc Tunzini, Versailles (FR); Romaric Guillard, Palaiseau (FR); Ruth Lopez, Paris (FR); Jie Wen, Issy les Moulineaux (FR)

(73) Assignee: Valeo Equipments Electriques Moteur (FR)

( * ) Notice: Subject to any disclaimer, the term of this patent is extended or adjusted under 35 U.S.C. 154(b) by 851 days.

(21) Appl. No.: 13/885,112

(22) PCT Filed: Nov. 17, 2011

(86) PCT No.: PCT/FR2011/052671
§ 371 (c)(1),
(2), (4) Date: Sep. 27, 2013

(87) PCT Pub. No.: WO2012/069737
PCT Pub. Date: May 31, 2012

(65) Prior Publication Data
US 2014/0009016 A1 Jan. 9, 2014

(30) Foreign Application Priority Data
Nov. 23, 2010 (FR) .................................... 10 59629

(51) Int. Cl.
*H02K 9/22* (2006.01)
*H02K 11/04* (2016.01)
(Continued)

(52) U.S. Cl.
CPC ............ *H02K 11/048* (2013.01); *H01L 25/16* (2013.01); *H02K 9/22* (2013.01); *H02K 11/33* (2016.01); *H01L 2924/0002* (2013.01)

(58) Field of Classification Search
CPC ......... H02K 11/048; H02K 11/33; H02K 9/22
See application file for complete search history.

(56) References Cited

U.S. PATENT DOCUMENTS

| 4,952,829 | A | * | 8/1990 | Armbruster | ........... H01L 25/115 |
| | | | | | 257/E25.026 |
| 5,682,070 | A | * | 10/1997 | Adachi | .................. H02K 19/22 |
| | | | | | 310/68 D |

(Continued)

FOREIGN PATENT DOCUMENTS

| DE | 10 2009 044240 | 7/2010 |
| FR | 2886477 | 12/2006 |

*Primary Examiner* — Dang Le
(74) *Attorney, Agent, or Firm* — Berenato & White, LLC

(57) ABSTRACT

An architecture of interconnected electronic power modules for a polyphase rotary machine, includes electrically interconnected power modules (5) and a connector (6) including one or more layers formed by pluralities of conductive traces borne by plates, such as to connect the power modules (51 to 53) to one another and to electrical elements of the rotary machine. The power modules (51 to 53) include a plurality of connection elements (510 to 530) brazed directly to components of the power modules (51 to 53) and, in the upper part, to conductive traces of the connector (6). This architecture includes a heat sink (4) equipped with open cavities (41 to 43) for receiving the power modules (51 to 53). A polyphase rotary machine is also provided using such (Continued)

an architecture, in particular a dual three-phase alternator with synchronous rectification.

<div align="center">

12 Claims, 4 Drawing Sheets

</div>

(51) Int. Cl.
*H01L 25/16* (2006.01)
*H02K 11/33* (2016.01)

(56) References Cited

U.S. PATENT DOCUMENTS

| | | | |
|---|---|---|---|
| 6,201,696 B1* | 3/2001 | Shimizu | H01L 23/24 |
| | | | 165/80.2 |
| 2006/0175906 A1* | 8/2006 | Hino | G09B 23/18 |
| | | | 310/1 |
| 2011/0127863 A1* | 6/2011 | Tunzini | H01L 25/072 |
| | | | 310/71 |

* cited by examiner

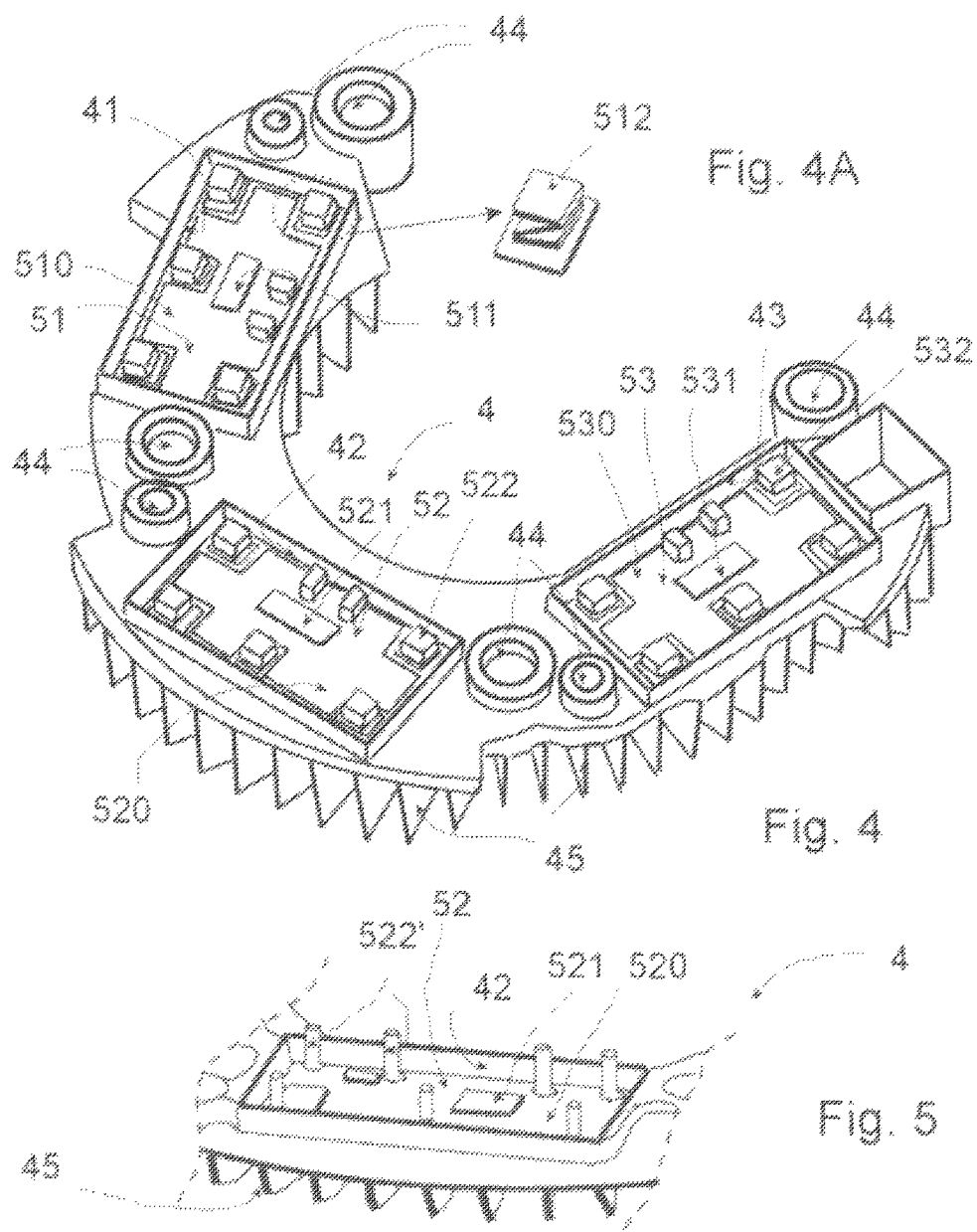

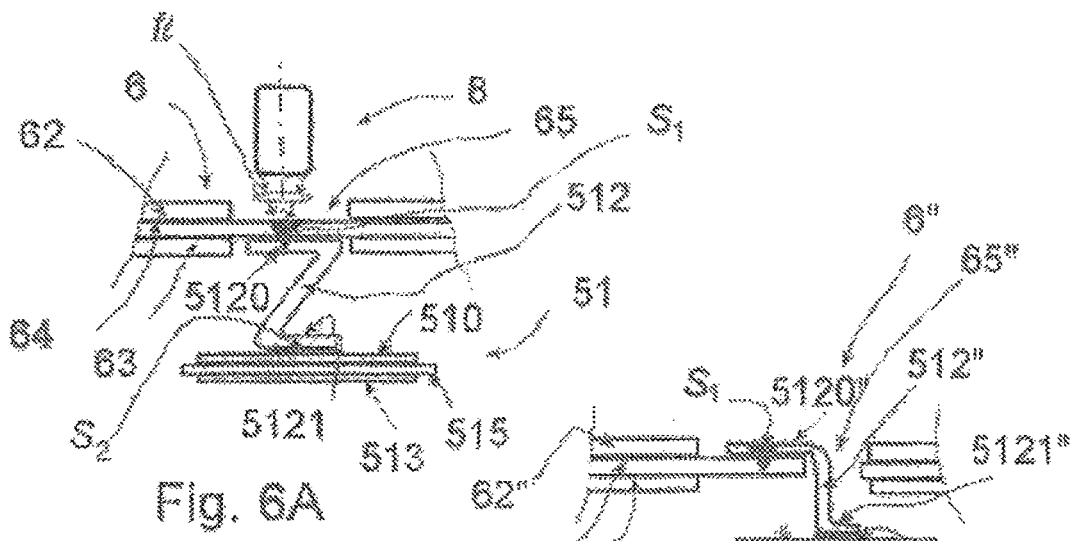
Fig. 6A
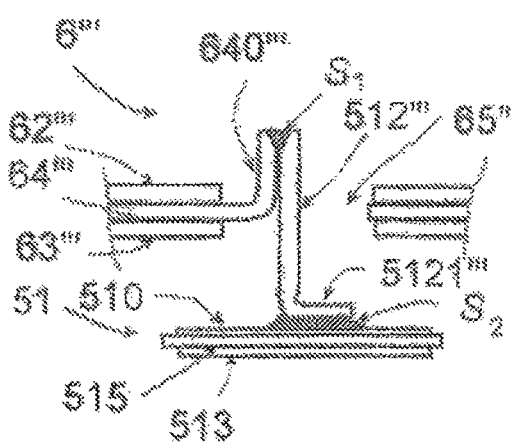
Fig. 6D
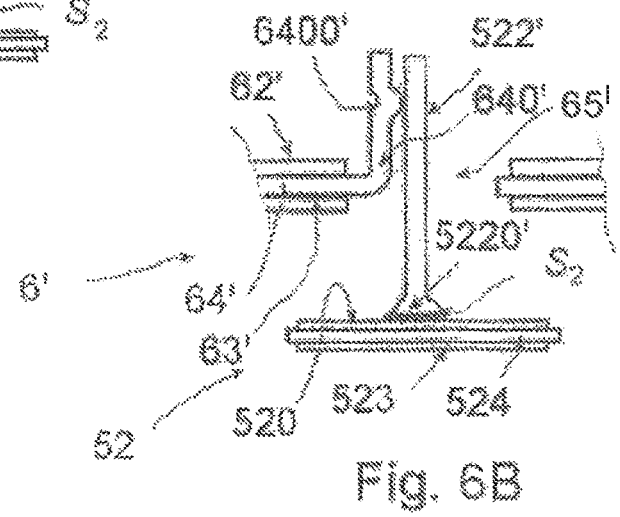
Fig. 6C
Fig. 6B

ARCHITECTURE OF INTERCONNECTED ELECTRONIC POWER MODULES FOR ROTARY ELECTRICAL MACHINE, AND ROTARY ELECTRICAL MACHINE COMPRISING ARCHITECTURE OF THIS TYPE

CROSS-REFERENCE TO RELATED APPLICATIONS AND CLAIM TO PRIORITY

This application is a national stage application of International Application No. PCT/FR2011/052671 filed Nov. 17, 2011, which claims priority to French Patent Application No. 10/59629 filed Nov. 23, 2010, of which the disclosures are incorporated herein by reference and to which priority is claimed.

The present invention relates in general to the field of rotary electrical machines, in particular for motor vehicles.

More particularly, it applies to alternators with synchronous rectification equipped with electronic power modules, and even more particularly to polyphase alternators.

For the sake of clarity of the concepts, reference will be made hereinafter to the preferred application of the invention, and it will be assumed that the alternator is of the three-phase type, without this limiting in any way the scope of the invention.

By way of example the French patent FR2886477B1 describes a rotary electrical machine of the alternator-starter type, comprising electronic power means. These electronic power means are in the form of modules of the so-called mechatronic type, including a power transistor bridge which uses MOSFET technology, and ensure a reversible function of an analogue-direct power converter ("AC/DC" according to the terminology commonly used).

In the mode of functioning as an alternator of the rotary electrical machine, the aforementioned converter ensures the rectification of the alternating phase voltages produced by the alternator into a single direct supply voltage (typically of 14 Volts) which supplies an on-board supply network of the motor vehicle. Conversely, as is well known to persons skilled in the art, in the mode of functioning as a motor/starter of the rotary electrical machine, the converter provides phase voltages which supply stator windings of the rotary electrical machine. This therefore gives rise to rotation of the rotor of the rotary electrical machine which has sufficient mechanical torque, such as to ensure the starting of the thermal engine of the vehicle. The phase voltages are obtained by cutting off, by means of the power transistor bridge, the direct voltage of the on-board supply network (direct voltage supplied by an energy storage battery).

The electronic power means described in the aforementioned French patent FR2886477B1 comprise three identical modules, one per branch of the bridge, and a control module which incorporates a specialised integrated circuit known by the acronym "ASIC" (for "Application-Specific Integrated Circuit" according to the terminology commonly used). The branch modules of the bridge each form a branch of the transistor bridge.

The architecture of the branch module of the bridge according to this patent is described for example with reference to FIGS. 4A to 4E. MOSFET transistors in the form of bare electronic chips are soldered onto connection gates known as "leadframes" in the terminology commonly used, which are over-moulded in a mechatronic case. These leadframes are kept placed on a metal base plate by means of an electrically insulating small plate which is sandwiched between the leadframes and the base plate. The small plate has properties of good thermal conduction, such as to transmit the calories generated by the electronic chips to a heat sink which is placed below the metal base plate of the module.

The technology which is disclosed by French patent FR2886477B1 has various applications in rotary electrical machines, and in particular gives very good results in terms of quality and performance in applications of the alternator-starter type which require a reversible rectifier bridge.

However, as previously stated, the power modules need a base plate to conduct heat, which in reality acts as an intermediate sink, since the arrangement described does not make it possible to place the semiconductor chip directly on the main sink. In addition, the flow of heat must pass through the small insulating plate. Even if the latter is selected such as to be a good conductor of heat, this solution is not optimised.

Finally, as also previously stated, it is necessary to place the electronic chips in a so-called mechatronic technology case.

These arrangements increase the complexity and the number of mechanical parts used, and consequently in particular they increase the cost price.

Whilst maintaining the advantages of the devices according to the known art, in particular those described in French patent FR-28864 7781, the object of the invention is to eliminate the disadvantages of the latter, some of which have just been described.

The subject of the invention is an architecture of interconnected electronic power modules for a polyphase rotary electrical machine.

For this purpose, according to a first important characteristic, the power modules are implemented directly in a heat sink.

According to a particular embodiment, the power modules each comprise the electronic power circuits of two branches of a synchronous rectifier bridge, and control circuits of the electronic power circuits.

Preferably, the power circuits are produced on the basis of a MOSFET transistor. The control circuits are preferably produced using so-called "ASIC" technology (acronym for the expression commonly used "Application-Specific Integrated Circuits"). The power modules comprise the actual electronic power circuits and the control circuits present in the form of substrates using so-called "DBC" technology (acronym for the expression commonly used "Direct Bonded Copper") which has many advantages, in particular good thermal conductivity. The substrate is constituted by three layers comprising a lower layer made of copper or aluminium, a median insulating layer made of ceramic (alumina, beryllium oxide, etc.), and an upper layer made of conductive material, generally copper. This layer is subdivided into a plurality of conductive tracks, the electronic components of the power module being soldered on these tracks. This technology is well known to persons skilled in the art, and does not need to be described in greater detail hereinafter.

According to another important characteristic of the invention, the heat sink comprises cavities open in one of its surfaces which are each designed to receive one of the said power modules.

According to another important characteristic of the invention, the power modules are bonded directly on the base of the cavities in the sink. Preferably, after assembly, these cavities are filled with gel such as to cover and insulate the power modules.

According to another important characteristic of the invention, the interconnections between the terminals of the phase windings of the rotary machine, the terminals of the source of direct electrical energy of the vehicle (generally a positive terminal known as B+ and the ground) and the power terminals of the branches of the rectifier bridge and for the signal of the control circuits, are produced firstly by means of first means comprising a plate made of insulating material, for example plastic, comprising a plurality of conductive tracks, which for example are made of copper, and, secondly, a plurality of input-output elements for connection with the electronic circuits of the aforementioned substrates, of the type such as tongues, nails, studs or pins, which are previously soldered on these substrates.

According to yet another important characteristic of the invention, the electrical connections between the said input-output elements for connection of the electronic circuits are obtained by welding of the electrical or laser type, according to different mechanical and geometric configurations which will be described hereinafter.

The main object of the invention is thus an architecture for interconnected electronic power modules for a polyphase rotary machine, characterised in that it comprises at least two power modules which are interconnected electrically, in that it comprises a connector comprising at least one layer constituted by a plurality of conductive tracks supported by at least one plate made of insulating material in order firstly to interconnect the said power modules to one another, and secondly to connect the said power modules to electrical elements of the said rotary machine, in that the said power modules comprise a plurality of connection elements which are connected electrically at a first end to components of the said power modules, and at a second end to one of the said conductive tracks of the connector, and in that it additionally comprises a heat sink provided with open cavities which are each designed to receive one of the said power modules.

The object of the invention is also a polyphase rotary machine comprising an architecture of this type of interconnected power modules.

The invention will now be described in greater detail with reference to the attached drawings, in which:

FIG. 4 illustrates schematically the mounting of the power modules in the cavities in the sink represented in FIG. 3;

FIG. 4A is a detailed view of a connection element represented in FIG. 4;

FIG. 5 is a partial view of the sink and of a power module represented in FIG. 4, illustrating another embodiment of the connection elements; and FIGS. 6A to 6D illustrate four embodiments according to the invention of elements for connection of the power modules to an interconnection connector, and the welding processes implemented in these embodiments.

Hereinafter, without in any way limiting the scope of the invention, the context will be the preferred application of it, unless otherwise stated, i.e. the case of an alternator with synchronous rectification of the double three-phase type, comprising three power modules, each comprising the electronic power circuits of two branches of a rectifier bridge and control circuits for these electronic power circuits.

Also hereinafter, elements which are identical or at least similar in the figures bear the same references, and will be described again only if necessary.

Figure 1:
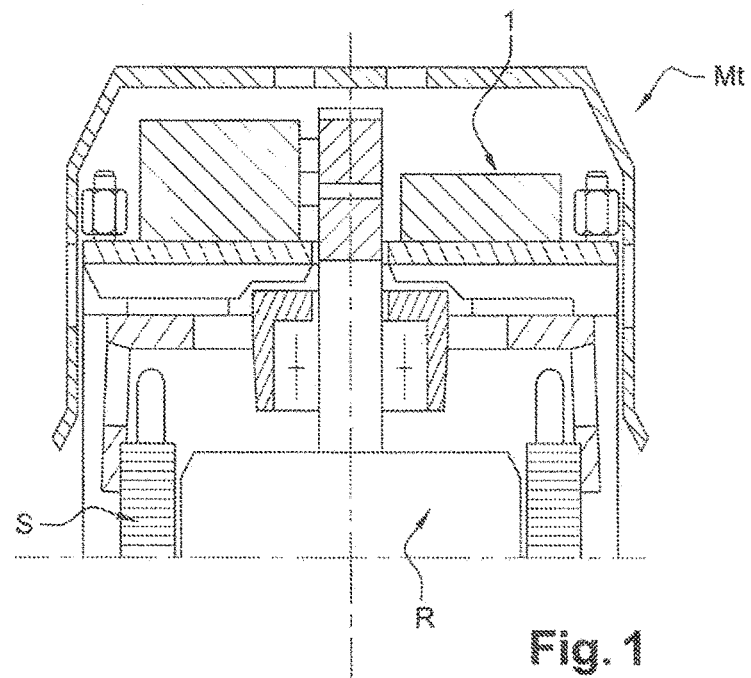
FIG. 1 illustrates schematically, in longitudinal cross-section, an example of a structure of a rotary electrical machine according to the known art.
Figure 2:
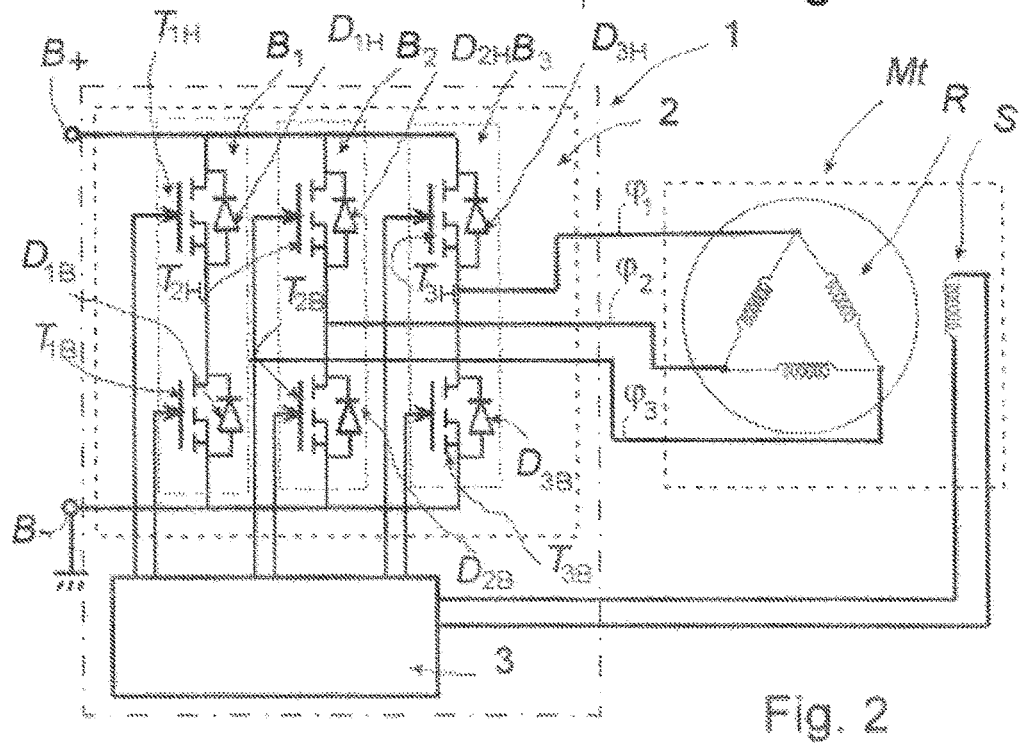
FIG. 2 illustrates schematically an example of a voltage rectifier circuit of the type with synchronous rectification.

Before describing the invention, it is advantageous to recall briefly the general structure of a machine of this type and an example of electronic power circuits of the rectifier bridge and of an electronic circuit for control of these circuits, with reference to FIGS. 1 and 2.

FIG. 1 illustrates highly schematically, in longitudinal cross-section, an example of a structure of a rotary electrical machine Mt according to the known art, i.e. in this case a three-phase alternator with synchronous rectification. This alternator comprises in a conventional manner a stator S and a rotor R, as well as an electronic power module, which contains the actual electronic power circuits (rectifier bridge) and control circuits for these power circuits.

FIG. 2 illustrates an example of a configuration of electrical and electronic circuits which can be implemented in the three-phase alternator Mt in FIG. 1.

As illustrated in FIG. 2, the alternator-starter Mt is associated with electronic power and control circuits with the general reference 1. These circuits comprise a synchronous voltage rectifier bridge 2 and control circuits 3. The rotor R is rotated by a drive belt which connects it to the crankshaft of the thermal engine 5 of the vehicle (not illustrated in FIG. 1).

In this embodiment, the alternator Mt is a three-phase machine of the Lundell type.

FIG. 2 illustrates schematically an example of a voltage rectifier circuit 2 of the type with synchronous rectification. This comprises substantially a voltage rectifier bridge constituted by three branches $B_1$ to $B_3$ and the control circuits 3 of the bridge 2.

In the example described, each branch $B_1$ to $B_3$ of the bridge 2 comprises two power transistors in cascade of the MOSFET type, $T_{1H}$-$T_{1B}$, $T_{2H}$-$T_{2B}$, $T_{3H}$-$T_{3B}$ respectively. The signs H and B signify arbitrarily the top and bottom of the branch respectively. The top ends of the branches $B_1$ to $B_3$ are connected to the terminal B+ and the bottom ends are connected to the terminal B− (generally connected to the ground) of a direct electrical energy storage unit (battery of the vehicle, not illustrated in FIG. 2). In a conventional manner, anti-parallel diodes $D_{1H}$ to $D_{3B}$ are connected to the source and drain terminals of the MOSFET transistors $T_{1H}$ to $T_{3B}$.

The branches $B_1$ to $B_3$ are connected at their middle points to the three phase outputs $\phi_1$ to $\phi_3$ of the stator windings S.

The control circuits 3 supply to the gates of the MOSFET transistors $T_{1H}$ to $T_{3B}$ control signals $CG_{1H}$ to $CG_{3B}$ respectively.

The control circuits 2 comprise circuits for forming the gate control signals (not explicitly illustrated in FIG. 2), which carry out forming adapted to the signals $CG_{1H}$ to $CG_{3B}$ such as to obtain functioning with synchronous rectification of the MOSFET transistors $T_{1H}$ to $T_{1B}$ of the bridge 2. This type of functioning with synchronous rectification of the MOSFET transistors $T_{1H}$ to $T_{1B}$ is well known to persons skilled in the art, and need not be described in greater detail hereinafter.

The control circuits 2 also comprise regulation circuits (not explicitly illustrated in FIG. 2), such as to supply a direct voltage with predetermined precision between the terminals B+ and B−, conventionally of +12 V. This type of circuit is also well known to persons skilled in the art, and need not be described in greater detail hereinafter.

Also, these control circuits 3 supply an excitation current of the winding of the stator S.

Finally, the control circuits 3 can comprise circuits for detection of errors and/or of malfunctioning of the rectifier bridge 2, in particular in order to protect the MOSFET transistors $T_{1H}$-$T_{1B}$ if an overload is detected.

In the known art, and in particular that described by patent FR2886477B1, the bridge 2 is in reality divided into three parts corresponding to the three bridge branches $B_1$ to $B_3$. Each branch $B_1$ to $B_3$ is in the form of a substrate encapsulated in an independent so-called mechatronic case, and the control circuits are produced in the form of an "ASIC" integrated circuit, the assembly being completed by electrical interconnection and mechanical securing means. As stated in the preamble of the invention, this architecture has a certain number of disadvantages which need not be described here.

In the present invention, whilst retaining the general structure of a rotary machine according to the known art and the configuration of the electronic circuits as such, which represents a certain advantage, partitioning and physical implementation of the circuits are provided which avoid the aforementioned disadvantages, and make it possible to achieve the objectives set out, as will now be shown in relation with FIGS. 3 to 6D.

Figure 3:
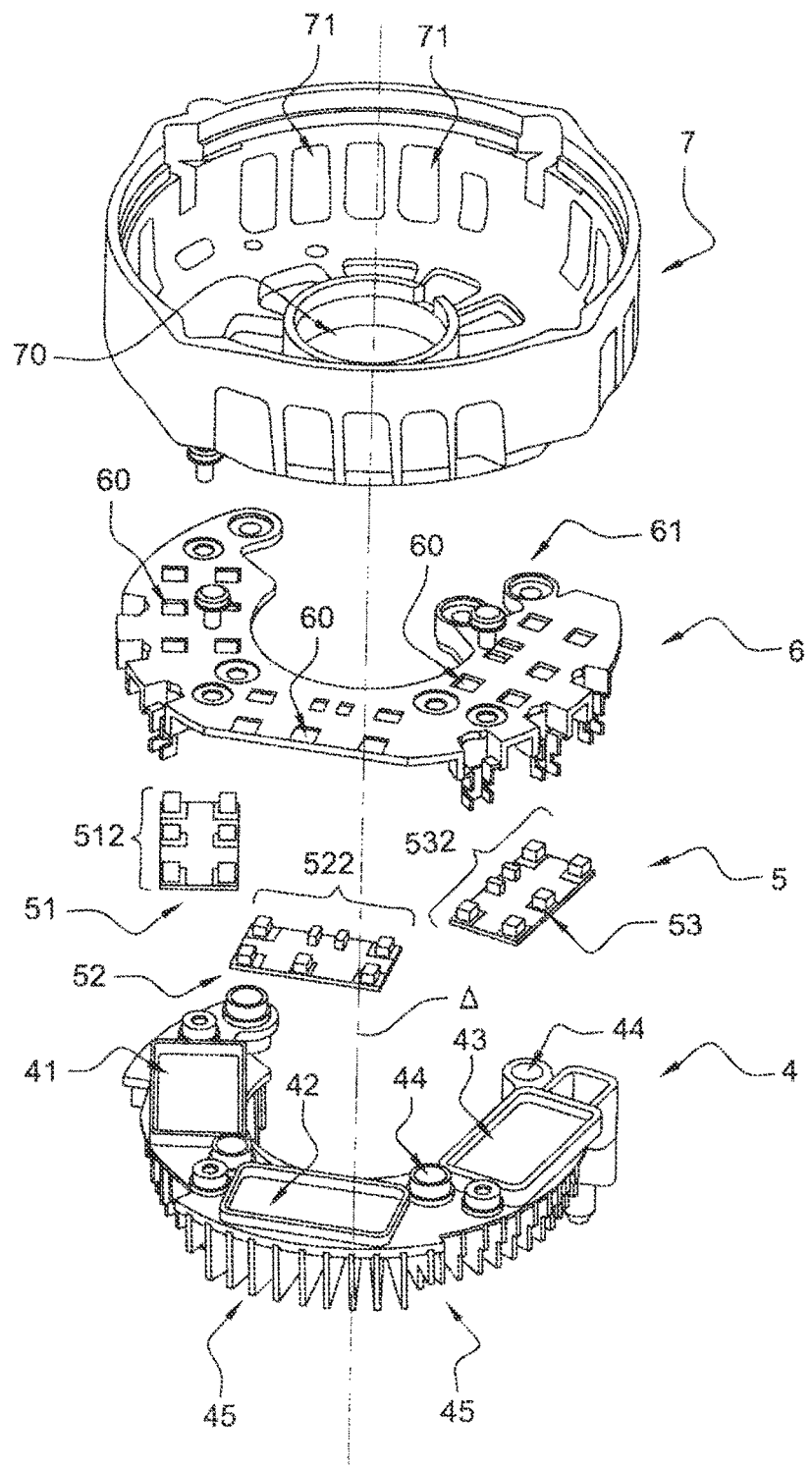
FIG. 3 illustrates in space and in exploded view the main subassemblies of an example of a preferred architecture of power modules and their interconnections for implementation of the process of interconnection of power modules according to the invention.

FIG. 3 illustrates in space and in exploded view around an axis of longitudinal symmetry Δ, the main subassemblies of an example of preferred architecture of power modules in which the process for interconnection according to the invention will be implemented.

The architecture illustrated in this figure relates to an alternator of the double three-phase type, and comprises three subassemblies which are specific to the invention, i.e. a heat sink 4, a series of power modules 5, with references 51 to 53, and means 6 for electrical interconnection between the series of modules 5. The power modules 5 of the series each comprise the electronic circuits of two rectifier bridge branches and the corresponding control circuits.

According to an important characteristic of the invention, the heat sink 4 is provided on its upper surface (in FIG. 3), which is substantially flat, with three open cavities 41 to 43 with a flat base which are designed to receive the modules 51 to 53. The lower surface of the sink 4 is provided in a conventional manner with fins 45 or similar units which are designed to improve the heat exchanges with the ambient air.

The heat sink 4 is in the general form of a "horseshoe" (arc of a circle) such as to allow free passage of the air in its central part, for the purpose of cooling of the inner units of the rotary machine (windings, etc.), of which only the upper mechanical part 7 (rear bearing) is represented in FIG. 3. In a habitual manner, the ambient air is aspirated towards the interior of the rotary machine by a fan which rotates with the rotor (not represented in FIG. 3). The part 7 comprises a plurality of orifices (with no reference) surrounding a central orifice 70 which is designed to receive a bearing capsule, and lateral orifices 71 which allow the air to enter the interior of the rotary machine.

In a conventional manner, after final assembly, the three sub-assemblies 4 to 6 are secured mechanically to the mechanical part 7 by any appropriate means (screws, etc.), with the "horseshoe" covering the periphery partially.

Each module 51 to 53 comprises a substrate which contains the electronic power circuits themselves (the MOSFET transistors of two branches of the hexaphase rectifier bridge) and control circuits of this bridge.

According to another characteristic of this architecture, the control circuits are distributed in the three modules 51 to 53, and are not centralized as for the example of the three-phase alternator in FIG. 2. They are in the form of integrated circuits which are preferably produced using "ASIC" technology.

Apart from these specific features, the functional diagrams of the power and control circuits implemented in the known art can be retained within the context of the invention, which represents an additional advantage as already indicated, since a new functional design of these circuits is not necessary.

The power and control circuits are arranged on a substrate, all preferably produced using "DBC" technology, and constituting the aforementioned power modules 51 to 53.

The substrates of the modules 51 to 53 will be described hereinafter with reference to FIG. 4. Connection elements (FIG. 3: under the general references 512, 522 and 532) which can have various configurations (and will be described in detail with reference to FIGS. 6A to 6D) are soldered or welded by ultrasound directly on the substrates of the modules 51 to 53, according to one of the important characteristics of the process for interconnection of power modules according to the invention. They make it possible to establish electrical connections with the means 6 for interconnection between modules 5.

The means 6 for interconnection are in the general form of a plate which constitutes a flat electrical connector. This plate comprises one or a plurality of flat layers made of insulating material, for example plastic of the PPS type. This plate supports a plurality of conductive trails or tracks, which for example are made of copper or any other appropriate metal, and can convey firstly so-called "strong" electric currents (connections with the terminals B+ and B− of the battery, the terminals of the branches of the rectifier bridge which are distributed in the modules 51 to 53, and the terminals of the windings of the rotary machine), and secondly so-called "weak" currents (control signals). The conductive tracks can be over-moulded and sandwiched between layers of insulating material of the plate 6.

Each aforementioned connection element, soldered on the substrates of the modules 51 to 53, is connected electrically to one or a plurality of conductive tracks, such as to form a network of interconnections with a predetermined configuration which connects the modules 51 to 53 to one another and a voltage regulator, which is also present in the alternator on the one hand, and these modules 51 to 53 on the other hand, to the rectified output voltage and phase terminals (terminal B+ and ground) of the alternator. For this purpose, the plate 6 which forms a connector has a geometry similar to that of the heat sink 4 (form of a "horseshoe"), such that the plate can be secured mechanically on the sink, after assembly of the modules 51 to 53, in the cavities 41 to 43.

The plate 6 additionally comprises areas under the general reference 60 which leave free access to the conductive tracks, the dimensions and spatial distribution of which are adapted to those of the connection elements 512, 522 and 532 which are soldered on the substrates of the modules 51 to 53.

The mechanical connection of the two subassemblies, i.e. the heat sink 4 and connector 6, is carried out by any conventional means well known to persons skilled in the art (screwing, etc.). For the sake of clarity of the concepts, FIG. 3 represents schematically means for securing with the general references 44 (heat sink 4) and 61 (connector 6). In addition, as already indicated, this assembly is also secured mechanically on the part 7 by any conventional means (not represented in FIG. 3).

FIG. 4 illustrates schematically, seen from above in space, the mounting of the modules 51 to 53 in the cavities 41 to 43 of the sink 4.

The modules 51 to 53 comprise substrates, only the upper layers of which have references, 510 to 530. These substrates are preferably produced using "DBC" technology. FIG. 4 also represents integrated circuits 511 to 531 which are supported by the substrates. In this embodiment of the invention, a single control circuit 511, 521 or 531 is provided per module 51 to 53. However, it should be understood that these modules can comprise a plurality of integrated circuits: in particular the bridge control circuits, which are preferably produced using "ASIC" technology, and the MOSFET transistors. Finally, connection elements are represented schematically. These connection elements are soldered directly on conductive tracks and/or on the integrated circuits of the modules 51 to 53, and are designed to establish galvanic contacts with the conductive tracks of the connector 6 (FIG. 3).

The geometric configurations and the embodiments of these elements will be described hereinafter with reference to FIGS. 6A to 6D.

A single connection element has specifically been given a reference in FIG. 4, i.e. the connection element 512 of the module 51, which is illustrated in greater detail in FIG. 4A. The element 512 has the general form of a tongue made of conductive material bent back into a "Z", with a flat lower surface which is in electrical contact with the substrate of the modules 51 to 53, and a flat upper surface which is designed to be put into electrical contact with one of the tracks of the connector 6 (FIG. 3). This embodiment corresponds to that which will be described with reference to FIG. 6A.

FIG. 5 illustrates another embodiment of connection elements, in the form of vertical cylindrical studs, of the semiconductor diode end type, or similar components (resistor, etc.). In FIG. 5, only the central part of the heat sink 4 is shown, i.e. the part corresponding to the cavity 42 and the module 52. With the exception of the embodiment of the connection element 522', the other elements in FIG. 5 are identical to those in FIG. 4, and need not be described again. This embodiment of the connection element corresponds to that which will be explained more particularly with reference to FIG. 6B, but it can also be implemented for the elements corresponding to those which will be explained with reference to FIGS. 6C and 6D.

Irrespective of the embodiment of the connection elements selected, the modules 51 to 53 are secured in the cavities 41 to 43 by bonding on the base of these cavities, directly on the sink 4, i.e. without intermediate elements, contrary to the known art described by French patent FR2886477B1. For the sake of clarity of the concepts, a glue of the silicon thermal type can be used for this purpose. After assembly of the modules 51 to 53 in the cavities 41 to 43, the latter can be filled with a gel such as, for example, a two-component silicone gel, which makes it possible to insulate the semiconductor components electrically, and to provide mechanical protection.

For the sake of clarity of the concepts, and without this limiting in any way the scope of the invention, a description will now be provided, with reference to FIGS. 6A to 6D, of four main embodiments of connection elements, as well as of the manner of connection of these connection elements to the conductive tracks of the connector 6 (FIG. 3).

FIG. 6A illustrates schematically a connection element 512 constituted by a flat tongue made of conductive material, which is bent in the manner of an accordion in order to assume the general form of a "Z". This embodiment corresponds to that which is illustrated in FIG. 4.

FIG. 6A represents schematically the substrate of the module 51, and it is assumed that it comprises a plate of insulating material 515, sandwiched between an underlying plate of conductive material 513 and conductive tracks 510 which run on the upper surface. The configuration is identical for the other substrates 52 or 53.

Each connection element 512 is welded (by means of the lower branch 5121 of the "Z") on a conductive track 510, or alternatively on a semiconductor element (MOSFET of the rectifier bridge not represented in FIG. 6A) by welding $S_2$. The upper layer 510 is constituted by a plurality of tracks for interconnection between the input and/or output terminals of the components of the power module (51 in the example in FIG. 6A) welded onto this layer.

FIG. 6A also represents a portion of the connector 6 overhanging the module 51 and the connection element 512. It is assumed in the example described that the connector 6 comprises a single layer 64 of tracks of conductive material, sandwiched between two plates of insulating material, i.e. an upper 62 and a lower 63 plate. It will be appreciated that it must be understood that the invention is not limited to a single layer of conductive tracks. In fact, according to a variant embodiment not represented, it is possible to provide a plurality of superimposed layers of conductive tracks which are separated by plates of insulating material.

Recesses 65 are provided in the areas of the insulating plates 62 and 63 which overhang the upper branches 5120 of the connection elements 512.

According to this embodiment, as a result of their form in the shape of a "Z" and the resilient properties of the material which constitutes the tongue, the connection elements 512 are provided with a "spring" function, which makes it possible to ensure good mechanical contact by exerting a support force when the connector 6 is put into place.

The tracks 64 of the connector 6 are welded on the connection element 512 (on the upper branch 5120 of the "Z") by laser welding by transparency, i.e. through the conductive track 64 by welding $S_1$. The laser 8 which makes possible this operation is illustrated schematically in FIG. 6A, as is the beam emitted fl which converges on the upper branch 5120 of the "Z".

A laser weld has the advantage of requiring less energy than welding by resistance. There is therefore less risk of damaging the soldering on the substrates and the semiconductor components (MOSFETS).

For the sake of clarity of the concepts, the characteristics of the process for production of the electrical connections are typically as follows:

ideally, the thickness of the track 63 to be passed through should not exceed 0.6 mm;

the thickness of the track situated below (i.e. the upper branch 5120 of the "Z") must be at least equal to the thickness of the track passed through 64;

the maximum play admissible between the tracks 64 and 5120 for a through weld is approximately 20% of the thickness passed through, i.e. 0.12 mm in the example selected;

a pressure force on the connector 6 is necessary and must be calculated so as not to damage the substrate 52 and its components;

in order to obtain a good laser weld by transparency, the track above 64 must be subjected to a mat surface treatment of the nickel plating type in order to limit the reflection of the laser beam (for example by using the nickel plating technology known as "Sulfamat"—registered trademark). On the other hand, tin and phosphorus are not acceptable because they are liable to create cracks in the weld.

FIG. 6B illustrates schematically a connection element 522' constituted by a cylindrical stud made of conductive material, perpendicular to the plane of the upper layer 520 of the substrate 52 (or of the other substrates 51 or 53). The stud 522' comprises a base with a larger diameter soldered directly (by welding $S_2$) on the upper layer 520 of the underlying substrate 52 (or alternatively on a power component i.e. MOSFET, not represented). The upper layer 520 is constituted by a plurality of tracks for interconnections between the input and/or output terminals of the components of the power module (52 in the example in FIG. 6B) welded on this layer. This embodiment corresponds to that which is illustrated in FIG. 5. FIG. 6B further represents schematically the substrate of the module 52, and it is assumed that it comprises a plate of insulating material 524, sandwiched between an underlying plate of conductive material 523 and conductive tracks 520 which run on the upper surface.

According to this embodiment, and in the example described in FIG. 6B, the connector, which henceforth has the reference 6', is assumed to comprise, as in the example in FIG. 6A, a single layer of conductive tracks 64', sandwiched between two plates of insulating material 62' and 63'. On the other hand, again in this embodiment, it is necessary for the conductive track 64', and not only the insulating plates 62' and 63', also to be provided with a receptacle 65' in order to allow free passage at the upper end of the connection element 522' through the stack of layers 62'-64'-63'. One of the ends 640' of the conductive track 64' is extended into the recess area 65'. It is bent back by 90° upwards. The latter comprises a dish 6400' which is designed to be put into contact with the connection element 522' in its upper part.

In this embodiment, the weld between the track 64' and the connection element is produced by a process of welding by resistance at the level of the dish 6400'. This is a process well known to persons skilled in the art. It is commonly used, in particular in order to weld ends of semiconductor diodes or equivalent components.

For the sake of clarity of the concepts, according to this variant, the characteristics of the process for production of the electrical connections is typically as follows:
- the process of welding by resistance is well controlled, and does not pose a particular problem if the elements to be welded (studs 522' and track 64') have dimensions similar to those of the aforementioned semiconductor diodes;
- typically, the studs 522' have a diameter of 1.2 mm;
- as a variant, instead of being cylindrical, the studs 522' can be provided with a square or rectangular cross-section, if the bent-back tongue 640' of the track 64' comprises a dished pin;
- typical parameters of the welding are as follows: force of 35 DaN, electric current of approximately 8000 A with 2 V for a period of time of 20 to 30 ms. The electrodes must descend to a minimum of 1.5 mm below the boss 6400' of the track 64'.

FIG. 6C illustrates an additional variant embodiment of the connection elements, which henceforth have the reference 512".

As previously, the connection element 512" is constituted by a cylindrical stud made of conductive material, perpendicular to the plane of the upper layer 510 of the substrate 51 (or of the other substrates 52 or 53). The base 5121" of the latter, which can be constituted by bending back at 90°, is soldered (weld $S_2$) on the upper layer 510 of the underlying substrate 51 (or alternatively on a power component: MOSFET, not represented in FIG. 6C).

It is assumed, as previously, that there is a single conductive track 64" sandwiched between two plates made of insulating material 62" and 63". Also as previously, this conductive track 64" is pierced by an orifice 65", and is extended into the recess area whilst allowing the end of the stud 512" to pass through. The upper part 5120" of the element of the stud 512" is bent back by 90°, such as to come into contact with the upper surface of the end of the conductive track 64".

As for the connection embodiment described with reference to FIG. 6A, the weld is of the laser weld by transparency type, and has the advantages previously described. It is therefore the bent-back part 5120" of the pin which the laser beam passes through (not explicitly represented in FIG. 6C) and which is welded on the conductive track 64" by welding $S_1$. For the sake of clarity of the concepts, the characteristics of the process for production of the electrical connections are typically as follows:
- the track which the laser beam must pass through, i.e. the bent-back part 5120" of the stud 512", can be finer, with a thickness which can be as little as 0.3 mm, which makes possible;
- a lower level of energy necessary for welding;
- a conductive track thickness 64" of 0.8 mm to 1 mm, in order for the current to pass through;
- no need to resort to nickel plating of the tracks 64" of the connector 6";
- the contact between the tracks 64" and studs 512" is ensured simply by the bending operation.

FIG. 6D illustrates an additional variant embodiment of the connection element, henceforth with the reference 512'". The latter is similar to the connection element 512" as far as its spatial configuration is concerned, but it has a rectangular or square cross-section, and is not bent in its upper part. Its base 5121'", which can be bent back to a horizontal position, is soldered (weld $S_2$) on the upper layer 510 of the underlying substrate 51 (or alternatively on a power component: MOSFET, not represented).

As previously, it is assumed that the connector 6'" comprises only a single layer of conductive tracks 64'", sandwiched between two insulating plates 62'" and 63'".

It is also firstly necessary to provide a total opening 65'" in the insulating plates 62'" and 63'", and in the conductive track 64'", such as to allow the upper end of the stud 512'" to pass through, and secondly a track end 640'" which is bent back by 90° upwards, and is put into contact with the upper end of the stud 64'".

The welding is also carried out according to the laser process by transparency, using a laser similar to that represented in FIG. 6A. The relative arrangement of the two elements makes it possible to carry out laser welding (weld $S_1$) with raised edges on the respective ends of the conductive track 64'" and of the stud 512'".

For the sake of clarity of the concepts, the characteristics of the process for production of the electrical connections according to this variant are typically as follows:
- this solution requires tooling in order to place the conductive track 64'" against the stud 512'", since the maximum play in order to weld these elements correctly must not exceed 5% of the thicknesses of the elements in contact;
- the laser must be equipped with a vision adjustment system, or it must be mounted on the aforementioned placing tool, in order to ensure correct welding at the junction of the conductive track 64''' and the stud 512''';

nickel plating is possible on one or the other of the surfaces of the elements to be welded, or on both, but is no longer necessary;

for a track 64''' of the connector 6 with a thickness of 0.8 mm, the soldered connection element 5121''' must have a minimum thickness of 0.4 mm, and its thickness should preferably be identical to that of the conductive track 64''' at its end 640'''.

Reading the preceding description easily shows that the invention achieves well the objectives set out by it, and which need not be recalled in full.

However, the invention is not limited simply to the devices according to the embodiments explicitly described with reference to FIGS. 3 to 6D. Similarly, the architecture of interconnected electronic power modules obtained according to the devices described does not apply only to an alternator with a bridge with synchronous rectification, which constitutes the preferred application of it, but more generally to any polyphase rotary electrical machine comprising at least two power modules to be interconnected via connection elements, one of the ends of which is soldered or welded by ultrasound on these modules, and the other end of which is welded on a conductive track of a connector comprising at least one layer of conductive tracks supported by at least one insulating plate.

The invention claimed is:

1. An architecture for interconnected electronic power modules for a polyphase rotary machine, comprising:
    at least two power modules (51 to 53) interconnected electrically;
    a connector (6) comprising at least one layer comprising a plurality of conductive tracks (64) supported by at least one plate (62, 63) made of insulating material in order firstly to interconnect said power modules (51 to 53) to one another, and secondly to connect said power modules (51 to 53) to electrical elements (phases φ, B+, B−) of said rotary machine (Mt); and
    a heat sink (4) provided with open cavities (41 to 43) each configured to receive one of said power modules (51 to 53);
    said power modules (51 to 53) comprising a plurality of connection elements (512 to 532) electrically connected at a first end to components (510 to 530) of said at least two power modules (51 to 53), and at a second end to one of said conductive tracks (64) of said connector (6);
    each of said power modules (51 to 53) comprising semiconductor power components and integrated electronic control circuits (3).

2. The architecture according to claim 1, wherein said connector (6) comprises at least one layer of conductive tracks (64) sandwiched between two plates made of insulating material (62, 63), and wherein said conductive tracks (64) comprise connections with strong power which convey currents for interconnection between one another of said semiconductor power components and specific electrical elements (φ, B+, B−) of said rotary machine (Mt), and connections with low power which convey control signals for interconnection of said integrated electronic control circuits (3).

3. The architecture according to claim 1, wherein said substrates are direct bonded copper substrates, and including at least one lower layer (513) made of conductive material, an intermediate layer (515) made of insulating material, and an upper layer (510) including a plurality of tracks made of conductive material, on which said semiconductor power components and said integrated electronic control circuits (3) are secured, and wherein said connection elements (512 to 532) are soldered on said tracks of the upper layer (510) and/or on said semiconductor power components.

4. The architecture according to claim 3, wherein said integrated electronic control circuits (3) are in the form of specialized application-specific integrated circuits implemented on said substrates.

5. Architecture according to claim 1, wherein said connector (6) and said heat sink (4) are secured mechanically to one another (44, 61) and to a rear bearing (7) of said rotary machine (Mt).

6. The architecture according to claim 5, wherein said rear bearing (7) comprises orifices which are arranged around a central area (70) and allow the ambient air to enter in order to cool the units inside said rotary machine, and wherein said connector (6) and said heat sink (4) cover the peripheral surface of said rear bearing (7) around an arc of a circle to allow said ambient air free passage in said central area.

7. An architecture for interconnected electronic power modules for a polyphase rotary machine, comprising:
    at least two power modules (51 to 53) interconnected electrically;
    a connector (6) comprising at least one layer comprising a plurality of conductive tracks (64) supported by at least one plate (62, 63) made of insulating material in order firstly to interconnect said power modules (51 to 53) to one another, and secondly to connect said power modules (51 to 53) to electrical elements (phases φ, B+, B−) of said rotary machine (Mt); and
    a heat sink (4) provided with open cavities (41 to 43) each configured to receive one of said power modules (51 to 53);
    said power modules (51 to 53) comprising a plurality of connection elements (512 to 532) electrically connected at a first end to components (510 to 530) of said at least two power modules (51 to 53), and at a second end to one of said conductive tracks (64) of said connector (6);
    wherein each of said power modules (51 to 53) comprises semiconductor power components, integrated electronic control circuits (3) and a substrate on which said semiconductor power components and said integrated electronic control circuits (3) for the semiconductor power components are implemented, and wherein each of said substrates is bonded on a base wall of one of said open cavities (41 to 43).

8. The architecture according to claim 7, wherein said open cavities (41 to 43) are filled with insulating gel after said substrates have been bonded.

9. The architecture according to claim 7, wherein, with said rotary machine (Mt) being of the polyphase alternator type comprising a rotor (R) provided with a winding for each phase (φ), and each winding generating an alternating current, said semiconductor power components of each of said power modules (51 to 53) includes two of the branches (B) of a synchronous polyphase rectifier bridge (2), and said integrated electronic control circuits (3) are circuits distributed in each of said power modules (51 to 53), such as to generate control signals which are formed for each of said bridge branches (B).

10. The architecture according to claim 9, wherein said semiconductor power components are MOSFET transistors.

11. A polyphase rotary machine, comprising an architecture of interconnected electronic power modules, said architecture comprising:

at least two power modules (51 to 53) interconnected electrically;
a connector (6) comprising at least one layer comprising a plurality of conductive tracks (64) supported by at least one plate (62, 63) made of insulating material in order firstly to interconnect said power modules (51 to 53) to one another, and secondly to connect said power modules (51 to 53) to electrical elements (phases ϕ, B+, B−) of said rotary machine (Mt); and
a heat sink (4) provided with open cavities (41 to 43) each configured to receive one of said power modules (51 to 53);
said power modules (51 to 53) comprising a plurality of connection elements (512 to 532) electrically connected at a first end to components (510 to 530) of said at least two power modules (51 to 53), and at a second end to one of said conductive tracks (64) of said connector (6);
each of said power modules (51 to 53) comprising semiconductor power components, integrated electronic control circuits (3) and a substrate on which said semiconductor power components and said integrated electronic control circuits (3) for the semiconductor power components are implemented;
each of said substrates bonded on a base wall of one of said open cavities (41 to 43).

12. A polyphase rotary machine, comprising an architecture of interconnected electronic power modules, said architecture comprising:
at least two power modules (51 to 53) interconnected electrically;
a connector (6) comprising at least one layer comprising a plurality of conductive tracks (64) supported by at least one plate (62, 63) made of insulating material in order firstly to interconnect said power modules (51 to 53) to one another, and secondly to connect said power modules (51 to 53) to electrical elements (phases ϕ, B+, B−) of said rotary machine (Mt); and
a heat sink (4) provided with open cavities (41 to 43) each configured to receive one of said power modules (51 to 53);
said power modules (51 to 53) comprising a plurality of connection elements (512 to 532) electrically connected at a first end to components (510 to 530) of said at least two power modules (51 to 53), and at a second end to one of said conductive tracks (64) of said connector (6);
each of said power modules (51 to 53) comprising semiconductor power components and integrated electronic control circuits (3).

\* \* \* \* \*